US 10,825,875 B2

(12) United States Patent
Zhao et al.

(10) Patent No.: US 10,825,875 B2
(45) Date of Patent: Nov. 3, 2020

(54) OLED DISPLAY PANEL AND DISPLAY DEVICE

(71) Applicants: CHENGDU BOE OPTOELECTRONICS TECHNOLOGY CO., LTD., Chengdu, Sichuan (CN); BOE TECHNOLOGY GROUP CO., LTD., Beijing (CN)

(72) Inventors: Yanyan Zhao, Beijing (CN); Jianqiang Liu, Beijing (CN); Wei Zhang, Beijing (CN); Jingyi Feng, Beijing (CN)

(73) Assignees: CHENGDU BOE OPTOELECTRONICS TECHNOLOGY CO., LTD., Chengdu, Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/447,452

(22) Filed: Jun. 20, 2019

(65) Prior Publication Data

US 2020/0075695 A1 Mar. 5, 2020

(30) Foreign Application Priority Data

Aug. 30, 2018 (CN) .......................... 2018 1 1002809

(51) Int. Cl.
*H01L 27/32* (2006.01)
*G06K 9/00* (2006.01)
*H01L 51/52* (2006.01)

(52) U.S. Cl.
CPC ...... *H01L 27/3246* (2013.01); *G06K 9/00013* (2013.01); *G06K 9/00087* (2013.01); *H01L 51/5206* (2013.01)

(58) Field of Classification Search
CPC ............. H01L 27/3246; H01L 27/3283; H01L 27/3295; H01L 51/5206–5218;
(Continued)

(56) References Cited

U.S. PATENT DOCUMENTS 10,296,777 B2 * 5/2019 Du ...................... H01L 27/3262
2005/0157914 A1 * 7/2005 Kim ...................... H01L 31/112
382/127
(Continued)

FOREIGN PATENT DOCUMENTS

| CN | 106298859 A | 1/2017 |
|---|---|---|
| CN | 107977632 A | 5/2018 |
| CN | 108242453 A | 7/2018 |

OTHER PUBLICATIONS

First Office Action and English language translation, CN Application No. 201811002809.2, dated Mar. 5, 2020, 14 pp.

*Primary Examiner* — Michael Pervan
(74) *Attorney, Agent, or Firm* — Myers Bigel, P.A.

(57) ABSTRACT

An OLED display panel and a display device are disclosed. The OLED display panel includes a light shielding layer, a planarization layer, and an anode layer which are arranged on a substrate in this order. The anode layer includes a plurality of sub-electrodes independently disposed. The OLED display panel includes a display area including a fingerprint imaging area and a non-imaging area. The OLED display panel further includes a light blocking portion on a side of the planarization layer away from the substrate. An orthographic projection of the light blocking portion on the substrate is within an orthographic projection of a gap between two sub-electrodes on the substrate which lies in the non-imaging area.

12 Claims, 4 Drawing Sheets

(58) Field of Classification Search
CPC ... G06K 9/00013–2009/0006; G06K 9/00087; G09G 3/3225
See application file for complete search history.

(56) References Cited

U.S. PATENT DOCUMENTS

| | | |
|---|---|---|
| 2017/0033164 A1* | 2/2017 | Liu .................. G02B 5/223 |
| 2017/0162607 A1* | 6/2017 | Abe .................. H01L 27/3244 |
| 2019/0006440 A1 | 1/2019 | Sun et al. |
| 2019/0156097 A1 | 5/2019 | Liu et al. |
| 2019/0172887 A1 | 6/2019 | Sun et al. |

* cited by examiner

OLED DISPLAY PANEL AND DISPLAY DEVICE

CROSS REFERENCE TO RELATED APPLICATIONS

The present application claims priority to Chinese Patent Application No. 201811002809.2, filed on Aug. 30, 2018, the entire disclosure of which is incorporated herein by reference.

TECHNICAL FIELD

The present disclosure relates to the field of display technologies, and in particular, to an OLED display panel and a display device.

BACKGROUND

OLED (organic light emitting diode) display device has been considered as a promising next generation display technology due to advantages of thin thickness, light weight, wide viewing angle, active illumination, continuous adjustable color, low cost, high color gamut, high contrast, fast response, low energy consumption, low driving voltage, wide operating temperature range, simple production process, high luminous efficiency and flexibility.

With the development of display technologies, a screen ratio of the display device (a ratio of a display area to a display surface) is becoming larger. Since the fingerprint verification method is a security method which is relatively secure, the method using under-screen fingerprint verification (pinhole imaging) has become a core technology in current display devices. In a known display device adopting the under-screen fingerprint verification method, the ambient light can enter the display panel and interfere with the light for fingerprint imaging, the resulting fingerprint image may be blurred, which affects the effect of fingerprint recognition.

SUMMARY

In a first aspect, there is provided an OLED display panel. The OLED display panel comprises a light shielding layer, a planarization layer, and an anode layer which are arranged on a substrate in this order. The anode layer comprises a plurality of sub-electrodes which are independently disposed, and the OLED display panel comprises a display area which comprises a fingerprint imaging area and a non-imaging area. The OLED display panel further comprises a light blocking portion on a side of the planarization layer away from the substrate, and an orthographic projection of the light blocking portion on the substrate falls within an orthographic projection of a gap between two sub-electrodes of the plurality of sub-electrodes on the substrate which lies in the non-imaging area.

In one or more embodiments, the planarization layer is provided with a recessed portion in the non-imaging area, the recessed portion is located directly below the gap between the sub-electrodes in the non-imaging area along a thickness direction of the OLED display panel, and the light blocking portion is disposed within the recessed portion.

In one or more embodiments, the anode layer comprises a light shielding material, the light blocking portion and the sub-electrodes are formed by a same patterning process, and at most one of the sub-electrodes at both sides of the light blocking portion is integrally formed with the light blocking portion.

In one or more embodiments, for the sub-electrodes at both sides of the light blocking portion, the sub-electrode adjacent to the fingerprint imaging area is integrally formed with the light blocking portion.

In one or more embodiments, the light blocking portion extends from a side of the recessed portion to a bottom of the recessed portion.

In one or more embodiments, the recessed portion comprises a curved bottom surface.

In one or more embodiments, the light shielding layer is provided with an imaging hole which is configure to image and a connection hole which is configured to connect the anode layer with a data line, the imaging hole is located in the fingerprint imaging area, and the connection hole is located in the non-imaging area.

In one or more embodiments, the OLED display panel further comprises a pixel defining layer on a surface of the anode layer away from the substrate, and a surface of the pixel defining layer away from the substrate is parallel to the substrate.

In one or more embodiments, the light blocking portion is formed of an insulating material.

In one or more embodiments, the light blocking portion is formed of a conductive material, and the light blocking portion is connected at most to one of the sub-electrodes at both sides of the light blocking portion.

In one or more embodiments, the OLED display panel is a top-emitting OLED display panel.

In a second aspect, there is provided a display device, comprising the OLED display panel of the first aspect.

In one or more embodiments, the display device further comprises a fingerprint detector disposed on a side of the substrate of the OLED display panel away from the light shielding layer, wherein the fingerprint detector is located in the fingerprint imaging area.

BRIEF DESCRIPTION OF THE DRAWINGS

In order to more clearly illustrate the technical solutions in the embodiments of the present disclosure, the drawings to be used in the embodiments will be briefly described below. It is obvious that the drawings in the following description are only some embodiments of the present disclosure. Those skilled in the art can also obtain other drawings based on these drawings without creative work.

DETAILED DESCRIPTION OF EMBODIMENTS

The technical solutions in the embodiments of the present disclosure will be clearly and completely described below with reference to the accompanying drawings in the embodiments of the present disclosure. It is obvious that the described embodiments are only some of the embodiments of the present disclosure, and not all of the embodiments. All other embodiments obtained by those skilled in the art based on the embodiments of the present disclosure without creative work are within the protection scope of the disclosure.

List of reference numerals: 10—substrate; 20—light shielding layer; 21—imaging hole; 22—connection hole; 30—OLED light emitting device; 311—sub-electrode; 40—fingerprint detector; 50—data line; 60—planarization layer; 61—recessed portion; 70—light blocking portion; 80—thin film transistor; 90—pixel defining layer; 100—fingerprint imaging area; 200—non-imaging area; 300—ambient light; 31—anode layer; 312, 313—gap.

Embodiments of the present disclosure provide an OLED display panel and a display device, for alleviating the problem of a poor effect of fingerprint imaging effect due to ambient light interference.

Figure 1:
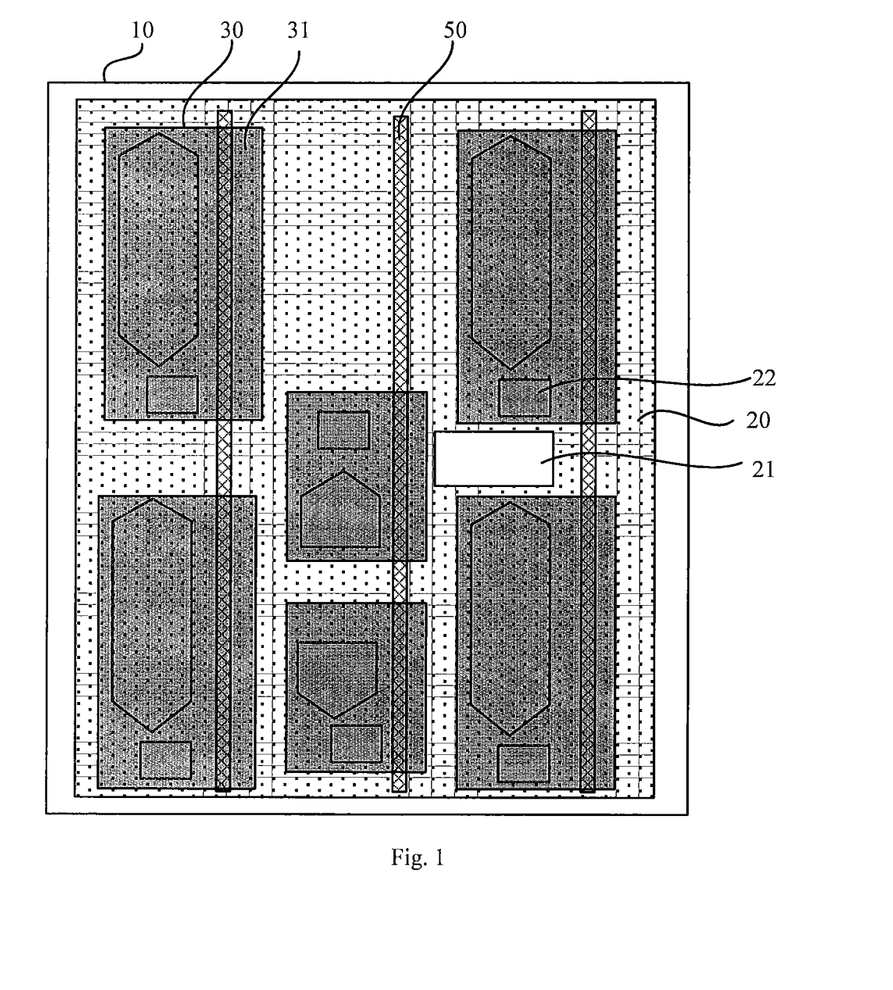
FIG. 1 is a schematic top view of an OLED display panel according to an embodiment of the present disclosure.
Figure 2:
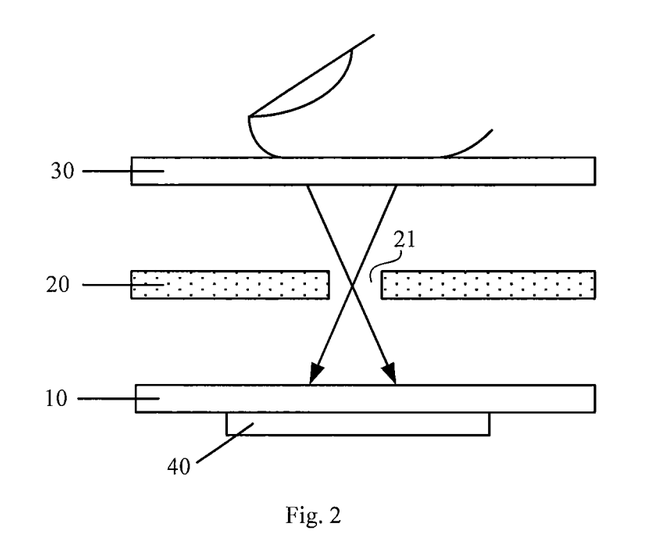
FIG. 2 is a schematic diagram of the principle for fingerprint detection of an OLED display panel according to an embodiment of the present disclosure.

As shown in FIG. 1, the OLED display panel comprises a substrate 10, a light shielding layer 20 on a side of the substrate 10, a plurality of OLED light emitting devices 30, and signal lines and control devices which are connected to the OLED light emitting devices 30, respectively. The OLED display panel comprises a display area comprising a fingerprint imaging area 100 and a non-imaging area 200. The light shielding layer 20 is provided with at least one imaging hole 21, the imaging hole 21 is located in the fingerprint imaging area, and an orthographic projection of the imaging hole 21 on the substrate 10 is located at a gap between the OLED light emitting devices 30, and does not overlap with an orthographic projection of the light-shielding components in the signal lines and the control devices on the substrate 10. As shown in FIG. 2, the OLED display panel further comprises a fingerprint detector 40 on the other side of the substrate 10, and the fingerprint detector 40 is configured to acquire an image of the finger above the OLED display panel which is formed through the imaging hole 21.

To ensure normal display operation, as shown in FIG. 1, the light shielding layer 20 is further provided with a connection hole 22. The connection hole connects the components in a same layer as a data line 50 (for example, a drain of a thin film transistor) to an anode layer 31 of the OLED light emitting device 30.

Figure 3:
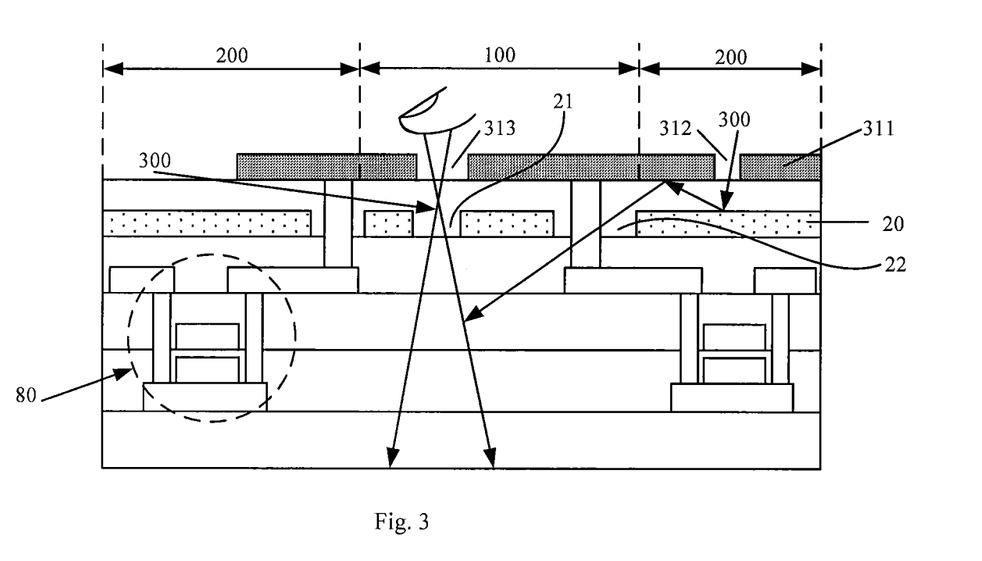
FIG. 3 is a schematic structural diagram of a known OLED display panel.

As shown in FIG. 3, during fingerprint detection, due to the presence of gaps 312, 313 between adjacent sub-electrodes 311 of the anode layer 31, ambient light 300 in the non-imaging area 200 can enter the OLED display panel through the gap 312, reflected between the anode layer 31 and the light shielding layer 20, and transmitted through the connection hole 22, thereby interfering with the light for fingerprint imaging. This impedes the fingerprint from being effectively imaged.

Figure 4:
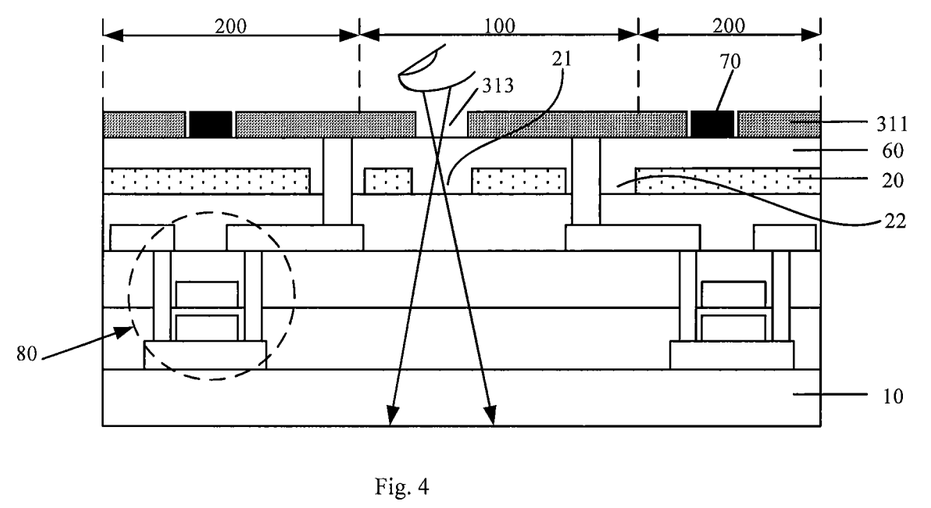
FIG. 4 is a first schematic structural diagram of an OLED display panel according to an embodiment of the present disclosure.

Based on this, as shown in FIG. 4, in an embodiment of the present disclosure, an OLED display panel comprises the light shielding layer 20, a planarization layer 60, and the anode layer 31 which are arranged on the substrate 10 in this order. The anode layer 31 comprises a plurality of sub-electrodes 311 which are independently disposed. The OLED display panel comprises a display area comprising the fingerprint imaging area 100 and the non-imaging area 200. The OLED display panel further comprises light blocking portions 70 on a side of the planarization layer 60 away from the substrate 10. In the non-imaging area 200, an orthographic projection of each of the light blocking portions 70 on the substrate 10 falls within an orthographic projection of each of the gaps 312 between the sub-electrodes 311 on the substrate 10. The signals which are loaded on the sub-electrodes 311 at both sides of each of the light blocking portions 70 do not interfere with each other.

It should be noted that, firstly, the imaging hole 21 in the light shielding layer 20 are generally disposed at the gaps between the OLED light emitting devices 30, such as the gaps 312, 313 between the sub-electrodes 311 shown in FIG. 3. The gap 312 between the sub-electrodes 311 is located in the non-imaging area, and the gap 313 between the sub-electrodes 311 is located in the fingerprint imaging area. The orthographic projection of the imaging hole 21 on the substrate 10 falls within the orthographic projection of the gap 313 between the sub-electrodes 311 on the substrate 10. The orthographic projection of each of the light blocking portions 70 on the substrate 10 falls within the orthographic projection of each of the gaps 312 (in the non-imaged area 200) on the substrate 10. The manner in which the fingerprint imaging area and the non-imaging area are divided may, for example, be the same as the known technique, and embodiments of the present disclosure are not limited in this regard.

Secondly, the orthographic projection of each of the light blocking portions 70 on the substrate 10 falls within the orthographic projection of each of the gaps 312 between the sub-electrodes 311 on the substrate 10. That is, the light blocking portions 70 are disposed in the non-imaging area 200. In addition, the light blocking portions 70 correspond to the gaps 312 between the adjacent sub-electrodes 311 in the non-imaging area 200, respectively. For example, in an exemplary embodiment, as shown in FIG. 4, the light blocking portions 70 are disposed at gaps 312 between adjacent sub-electrodes 311. In another exemplary embodiment, the light blocking portions 70 are located directly below the gaps 312 between the adjacent sub-electrodes 311, and disposed between the anode layer 31 and the light shielding layer 20. In yet another exemplary embodiment, the light blocking portions 70 are located directly above the gaps between the adjacent sub-electrodes 311, and are disposed on a side of the anode layer 31 away from the substrate 10, provided that the light blocking portions 70 are disposed on a side of the light shielding layer 20 away from the substrate 10. Furthermore, the light blocking portions 70 are disposed at the gaps between the sub-electrodes 311, but it is not required that all of the gaps 312 between the sub-electrodes 311 in the non-imaging area should be correspondingly provided with the light blocking portions 70. Rather, it is possible that only some of the gaps are correspondingly provided with the light blocking portions 70.

Thirdly, in order to ensure the normal display of the OLED display panel, the signals of the sub-electrodes 311 at both sides of the light blocking portion 70 do not interfere with each other, that is, the OLED light emitting devices 30 at both sides of the light blocking portion 70 can independently emit light. Based on this, it should be understood by those skilled in the art that in case the light blocking portions 70 are disposed at the gaps between the adjacent sub-electrodes 311, if the material of the light blocking portion 70 is an insulating material, the light blocking portion 70 can be connected to the sub-electrodes 311; and if the material of the light blocking portion 70 is a conductive material, the light blocking portion 70 can be connected to at most one of the sub-electrodes 311 on both sides of the light blocking portion 70, to ensure that the adjacent sub-electrodes 311 are not electrically connected through the light blocking portion 70.

Fourthly, as for the light shielding layer 20, the material, structure, location, preparation process, and the like known in the existing technology may be adopted, and embodiments of the present disclosure are not limited in this regard.

In addition, the OLED display panel may be, for example, a top-emitting OLED display panel, and the anode layer 31 in the OLED light emitting device 30 is disposed in a stacked structure comprising a light shielding metal film. For example, the anode layer 31 may be formed into a structure of ITO (Indium Tin Oxide)/Ag (silver)/ITO, and in this case the anode layer 31 is an opaque layer.

In the OLED display panel provided by the embodiments of the present disclosure, ambient light can be blocked from entering the OLED display panel through gaps between the sub-electrodes 311, since the light blocking portions 70 are disposed in areas corresponding to the gaps between the sub-electrodes 311. In this way, it is equivalent to reduce the gap portion between the sub-electrodes 311 capable of transmitting light, so as to reduce the interference of ambient light on the light for fingerprint imaging, which can improve the effect of fingerprint imaging and ensure the fingerprint recognition effect.

Figure 5:
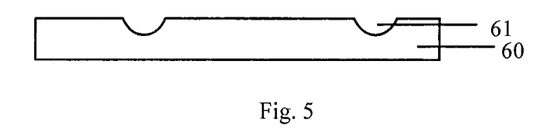
FIG. 5 is a schematic structural diagram of a planarization layer according to an embodiment of the present disclosure.
Figure 6:
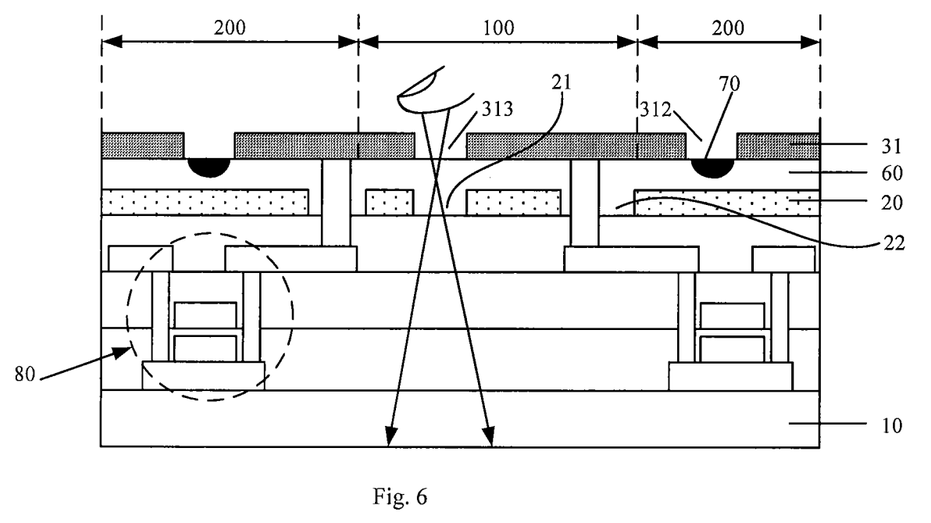
FIG. 6 is a second schematic structural diagram of an OLED display panel according to an embodiment of the present disclosure.

In order to reduce the thickness of the OLED display panel, in some embodiments, as shown in FIG. 5, the planarization layer 60 is provided with recessed portions 61. As shown in FIG. 6, the recessed portions 61 are disposed in the non-imaging area. The recessed portions 61 are located directly below the gaps between the sub-electrodes 311 along the thickness direction of the OLED display panel, and the light blocking portions 70 are disposed within the recessed portions 61.

The depth of the recessed portions 61 may be equal to the thickness of the planarization layer 60, or may be smaller than the thickness of the planarization layer 60. The depth of the recessed portions 61 is related to the conductivity of the film below the planarization layer 60 and the material of the light blocking portions 70, provided that the OLED display panel is not short-circuited due to the presence of the recessed portions 61.

Further, the shape of the recessed portions 61 is not limited, and for example, the recessed portions 61 may be grooves. Areas where the light blocking portions 70 are disposed are necessarily provided with the recessed portions 61, but areas where the recessed portions 61 are disposed are not necessarily provided with the light blocking portions 70. That is, orthographic projections of the recessed portions 61 on the substrate 10 are covered by orthographic projections of gaps between the sub-electrodes 311 on the substrate 10 which lie in the fingerprint imaging area, and orthographic projections of the light blocking portions 70 on the substrate 10 are covered by orthographic projections of the recessed portions 61 on the substrate 10.

Furthermore, as shown in FIG. 6, the recessed portions 61 are located directly below the gaps between the sub-electrodes 311. This means that when the light blocking portions 70 are removed, the recessed portions 61 are exposed from the gaps between the sub-electrodes 311, and the width of the gaps between the adjacent sub-electrodes 311 is not smaller than the width of the recessed portions 61.

As shown in FIG. 6, the width of the gaps between adjacent sub-electrodes 311 is larger than the width of the recessed portions 61. In some embodiments, the width of the gaps between adjacent sub-electrodes 311 is equal to the width of the recessed portions 61.

In addition, there is no limitation to the method for forming of the planarization layer 60. For example, it can be formed by performing a patterning process for one time with a halftone mask to simplify the preparation process.

Figure 7:
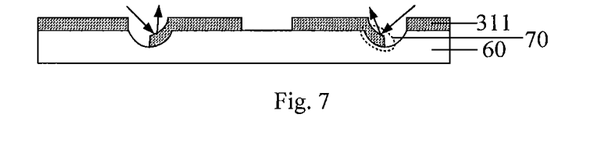
FIG. 7 is a schematic structural diagram of a planarization layer and an anode layer according to an embodiment of the present disclosure.

In some embodiments, as shown in FIG. 7, the anode layer 31 comprises a light shielding material, the light blocking portion 70 and the sub-electrode 311 are formed by a same patterning process, and at most one of the sub-electrodes 311 at both sides of the light blocking portion 70 is integrally formed with the light blocking portion 70.

That is, the light blocking portions 70 and the sub-electrodes 311 are arranged in a same layer and made from a same material, and the light blocking portions 70 also have a conduction function. In this case, in order to make the signals of the sub-electrodes 311 at both sides of the light blocking portion 70 not interfere with each other, the light blocking portion 70 and the sub-electrodes 311 at both sides of the light blocking portion 70 are discrete elements, or the light blocking portion 70 is integrally formed with only one of the sub-electrodes 311.

According to different requirements, as for the sub-electrodes 311 in the non-imaging area, it is possible that different sides of some sub-electrodes 311 are connected to the light blocking portions 70 respectively, and some of the sub-electrodes 311 are not connected to the light blocking portions 70. In case the sub-electrodes 311 connected to the light blocking portions 70 are not electrically connected, the plurality of light blocking portions 70 may be connected or not connected.

Here, by forming the light blocking portions 70 and the sub-electrodes 311 by a same patterning process, the problem of poor fingerprint imaging effect caused by the light leakage of the anode layer 31 can be alleviated without increasing the thickness of the display panel or increasing the number of patterning processes.

In order to prevent ambient light from irradiating the fingerprint imaging area, in some embodiments, as shown in FIG. 7, for the sub-electrodes 311 at both sides of the light blocking portions 70, the sub-electrode 311 adjacent to the fingerprint imaging area is integrally formed with the light blocking portion 70.

There is no limitation to the method for forming the anode layer 31. For example, the sub-electrode 311 with a shape that is recessed on one side can be formed by coating and etching.

The sub-electrode 311 adjacent to the fingerprint imaging area is connected to the light blocking portion 70, so that ambient light incident onto the display panel at an angle toward the fingerprint imaging area can be blocked by the light blocking portion 70. As compared with the case in which ambient light incident onto the display panel at an angle toward the non-imaging area is blocked, the solution provided by embodiments of the present disclosure is more effective in alleviating the interference of the ambient light on the light for fingerprint imaging.

In some embodiments, as shown in FIG. 7, the light blocking portion 70 extends from a side of the recessed portion 61 to the bottom of the recessed portion 61.

That is, the light blocking portions 70 are disposed in half areas of the recessed portions 61, so that in both the vertical direction and the lateral direction from the view angle of FIG. 7, the light blocking portions 70 have the largest light blocking areas, and the light blocking effect is the best. The light blocking portions 70 have the smallest areas, and the electrical connections between the adjacent sub-electrodes 311 can be avoided to the utmost extent.

From a viewpoint of process, in some embodiments, as shown in FIG. 7, the bottom surface of the recessed portion 61 is a curved surface.

That is, the outline of the recessed portion 61 is curved in the cross-section perpendicular to the extending direction of the recessed portion 61.

In order to reduce the parasitic capacitance of the OLED display panel, in some embodiments, as shown in FIG. 4 and FIG. 6, the OLED display panel further comprises a thin film transistor 80 disposed on a side of the light shielding layer 20 adjacent to the substrate 10, and the thin film transistor 80 is a top-gate thin film transistor.

In order to simplify the structure of the OLED display panel, in some embodiments, as shown in FIG. 1, the light shielding layer 20 is provided with an imaging hole 21 for imaging and a connection hole 22 for connecting the anode layer 31 to the data line 50. The imaging hole 21 is located in the fingerprint imaging area, and the connection hole 22 is located in the non-imaging area.

Figure 8:
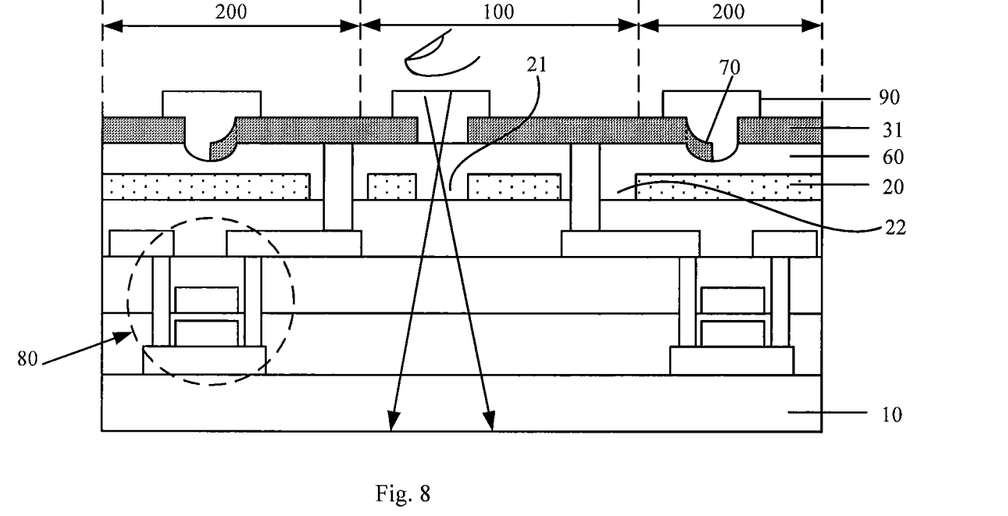
FIG. 8 is a third schematic structural diagram of an OLED display panel according to an embodiment of the present disclosure.

To ensure the stability of support posts, in some embodiments, as shown in FIG. 8, the OLED display panel further comprises a pixel defining layer 90 on a surface of the anode layer 31 away from the substrate 10. A surface of the pixel defining layer 90 away from the substrate 10 is parallel to the substrate 10.

As shown in FIG. 8, the pixel defining layer 90 is formed on the surface of the anode layer 31. After the pixel defining layer 90 fills up the gaps between the sub-electrodes 311 and the recessed portions 61, the surface of the pixel defining layer 90 away from the substrate 10 is parallel to the substrate 10.

Figure 9:
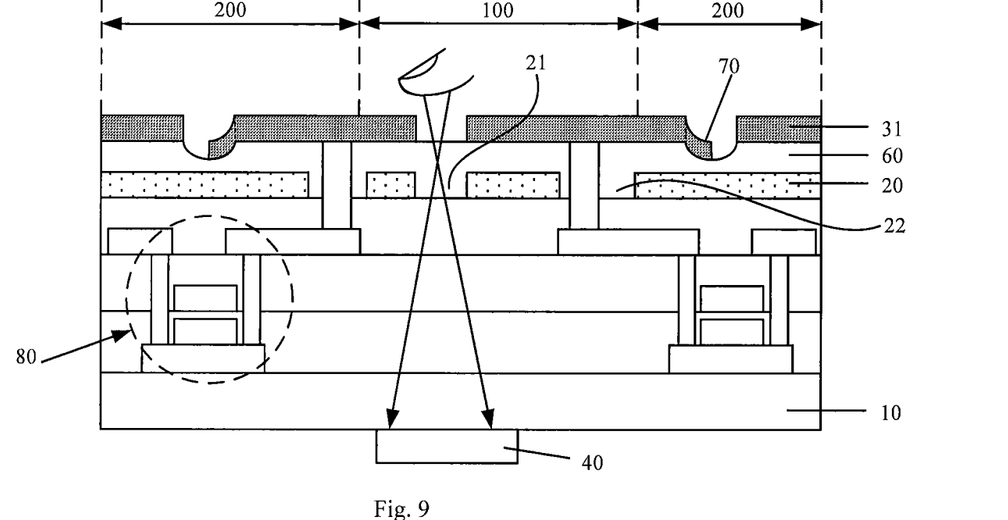
FIG. 9 is a schematic structural diagram of an OLED display device according to an embodiment of the present disclosure.

Embodiments of the present disclosure further provide a display device. As shown in FIG. 9, the display device comprises the above-mentioned OLED display panel, and further comprises a fingerprint detector 40 disposed on the back of the OLED display panel. The fingerprint detector 40 is located in the fingerprint imaging area.

The display device provided by the embodiments of the present disclosure comprises the above-mentioned OLED display panel, and the beneficial effects of the display device are the same as the beneficial effects of the above-mentioned OLED display panel, which are not described herein again.

Embodiments of the present disclosure provide an OLED display panel and a display device. Ambient light can be blocked from entering the OLED display panel through gaps between the sub-electrodes by disposing light blocking portions in areas corresponding to the gaps between the sub-electrodes. In this way, it is equivalent to reduce the gap between the sub-electrodes capable of transmitting light, so as to reduce the interference of ambient light on the light for fingerprint imaging, which can improve the effect of fingerprint imaging and ensure the fingerprint recognition effect.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

What is claimed is:

1. An OLED display panel, comprising:
a light shielding layer;
a planarization layer; and
an anode layer comprising a plurality of sub-electrodes which are independently disposed, wherein the light shielding layer, the planarization layer and the anode layer are on a substrate;
a display area comprising a fingerprint imaging area and a non-imaging area; and
a light blocking portion on a side of the planarization layer away from the substrate,
wherein an orthographic projection of the light blocking portion on the substrate is within an orthographic projection of a gap between two sub-electrodes of the plurality of sub-electrodes on the substrate in the non-imaging area,
wherein the planarization layer comprises a recessed portion in the non-imaging area,
wherein the recessed portion is directly below the gap between the sub-electrodes in the non-imaging area along a thickness direction of the OLED display panel, and
wherein the light blocking portion is in the recessed portion.

2. The OLED display panel of claim 1,
wherein the anode layer comprises a light shielding material,
wherein the light blocking portion and the sub-electrodes are formed by a same patterning process, and
wherein at most one of the sub-electrodes at both sides of the light blocking portion is integrally formed with the light blocking portion.

3. The OLED display panel of claim 2, wherein for the sub-electrodes at the both sides of the light blocking portion, a sub-electrode adjacent to the fingerprint imaging area is integrally formed with the light blocking portion.

4. The OLED display panel of claim 3, wherein the light blocking portion extends from a side of the recessed portion to a bottom of the recessed portion.

5. The OLED display panel of claim 1, wherein the recessed portion comprises a curved bottom surface.

6. The OLED display panel of claim 1, wherein the OLED display panel further comprises:
a pixel defining layer on a surface of the anode layer away from the substrate,
wherein a surface of the pixel defining layer away from the substrate is parallel to the substrate.

7. The OLED display panel of claim 1, wherein the light blocking portion comprises an insulating material.

8. The OLED display panel of claim 1,
wherein the light blocking portion comprises a conductive material, and
wherein the light blocking portion is connected at most to one of the sub-electrodes at both sides of the light blocking portion.

9. The OLED display panel of claim 1, wherein the OLED display panel comprises a top-emitting OLED display panel.

10. A display device comprising the OLED display panel of claim 1.

11. The display device of claim 10, further comprising:
a fingerprint detector on a side of the substrate of the OLED display panel away from the light shielding layer,
wherein the fingerprint detector is in the fingerprint imaging area.

12. An OLED display panel, comprising:
- a light shielding layer;
- a planarization layer; and
- an anode layer comprising a plurality of sub-electrodes which are independently disposed, wherein the light shielding layer, the planarization layer and the anode layer are on a substrate;
- a display area comprising a fingerprint imaging area and a non-imaging area; and
- a light blocking portion on a side of the planarization layer away from the substrate,
- wherein an orthographic projection of the light blocking portion on the substrate is within an orthographic projection of a gap between two sub-electrodes of the plurality of sub-electrodes on the substrate in the non-imaging area,
- wherein the light shielding layer has an imaging hole which is configured to project an image there through and a connection hole which is configured to connect the anode layer with a data line,
- wherein the imaging hole is in the fingerprint imaging area, and the connection hole is in the non-imaging area.

* * * * *